(12) United States Patent
Lipcsei

(10) Patent No.: US 7,471,144 B2
(45) Date of Patent: Dec. 30, 2008

(54) LOW DISTORTION CLASS-D AMPLIFIER

(75) Inventor: Laszlo Lipcsei, Campbell, CA (US)

(73) Assignee: O2 Micro International Limited, Grand Cayman (KY)

( * ) Notice: Subject to any disclaimer, the term of this patent is extended or adjusted under 35 U.S.C. 154(b) by 126 days.

(21) Appl. No.: 11/643,196

(22) Filed: Dec. 20, 2006

(65) Prior Publication Data

US 2007/0222507 A1     Sep. 27, 2007

Related U.S. Application Data

(60) Provisional application No. 60/785,105, filed on Mar. 22, 2006.

(51) Int. Cl.
*H03F 3/38* (2006.01)
*H03F 3/217* (2006.01)

(52) U.S. Cl. .................. 330/10; 330/207 A

(58) Field of Classification Search .......... 330/10, 330/136, 207 A, 251
See application file for complete search history.

(56) References Cited

U.S. PATENT DOCUMENTS 6,614,297 B2 * 9/2003 Score et al. ............ 330/10
7,221,216 B2 * 5/2007 Nguyen ................. 330/10

* cited by examiner

*Primary Examiner*—Robert Pascal
*Assistant Examiner*—Khiem D Nguyen

(57) ABSTRACT

A low distortion class-D amplifier. The amplifier comprises a power supply terminal for receiving power, an amplification stage, and an output stage. The amplification stage receives an input signal and generates a ramp signal. Further more, the amplification stage generates a pulse width modulation signal based on the ramp signal and a hysteretic signal. The output stage coupled to the power supply terminal receives the pulse width modulation signal and generates an output. Advantageously, the ramp signal and the hysteretic signal are positioned at a voltage level that is half the voltage level of said power supply and that varies proportionally with said power supply.

26 Claims, 3 Drawing Sheets

LOW DISTORTION CLASS-D AMPLIFIER

RELATED APPLICATIONS

This application claims the benefit of U.S. Provisional Application No. 60/785,105, filed on Mar. 22, 2006, the specification of which is hereby incorporated in its entirety by reference.

TECHNICAL FIELD

This invention relates to an amplifier, and more particularly to a low distortion class-D amplifier with high efficiency.

BACKGROUND ART

Conventional class-D amplifiers receive an analog input signal and generate a digital output signal. One advantage of a class D amplifier over a linear amplifier (e.g., a class-AB amplifier) is its high efficiency. Because the output pulses of the class-D amplifier have a fixed amplitude, the switching elements are switched either on or off, rather than operated in linear mode. One common application for a class-D amplifier is a driver for a loudspeaker.

However, most class-D amplifiers that employ standard implementations suffer from propagation delays and low power supply rejection ratio due to the switching waveforms.

SUMMARY OF THE INVENTION

The present invention provides a low distortion class-D amplifier. In accordance with one embodiment of the present invention, an amplifier comprises a power supply terminal for receiving a power supply, an amplification stage, and an output stage. The amplification stage receives an input signal and generates a ramp signal. Furthermore, the amplification stage generates a pulse width modulation signal based on the ramp signal and a hysteretic signal. The output stage coupled to the power supply terminal receives the pulse width modulation signal and generates an output. Advantageously, the ramp signal and the hysteretic signal are positioned at a voltage level that is half the voltage level of the power supply and that varies proportionally with the power supply.

BRIEF DESCRIPTION OF THE DRAWINGS

Features and advantages of embodiments of the claimed subject matter will become apparent as the following Detailed Description proceeds, and upon reference to the Drawings, wherein like numerals depict like parts, and in which:

DESCRIPTION OF EMBODIMENTS

Reference will now be made in detail to the embodiments of the present invention. While the invention will be described in conjunction with the embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Figure 1:
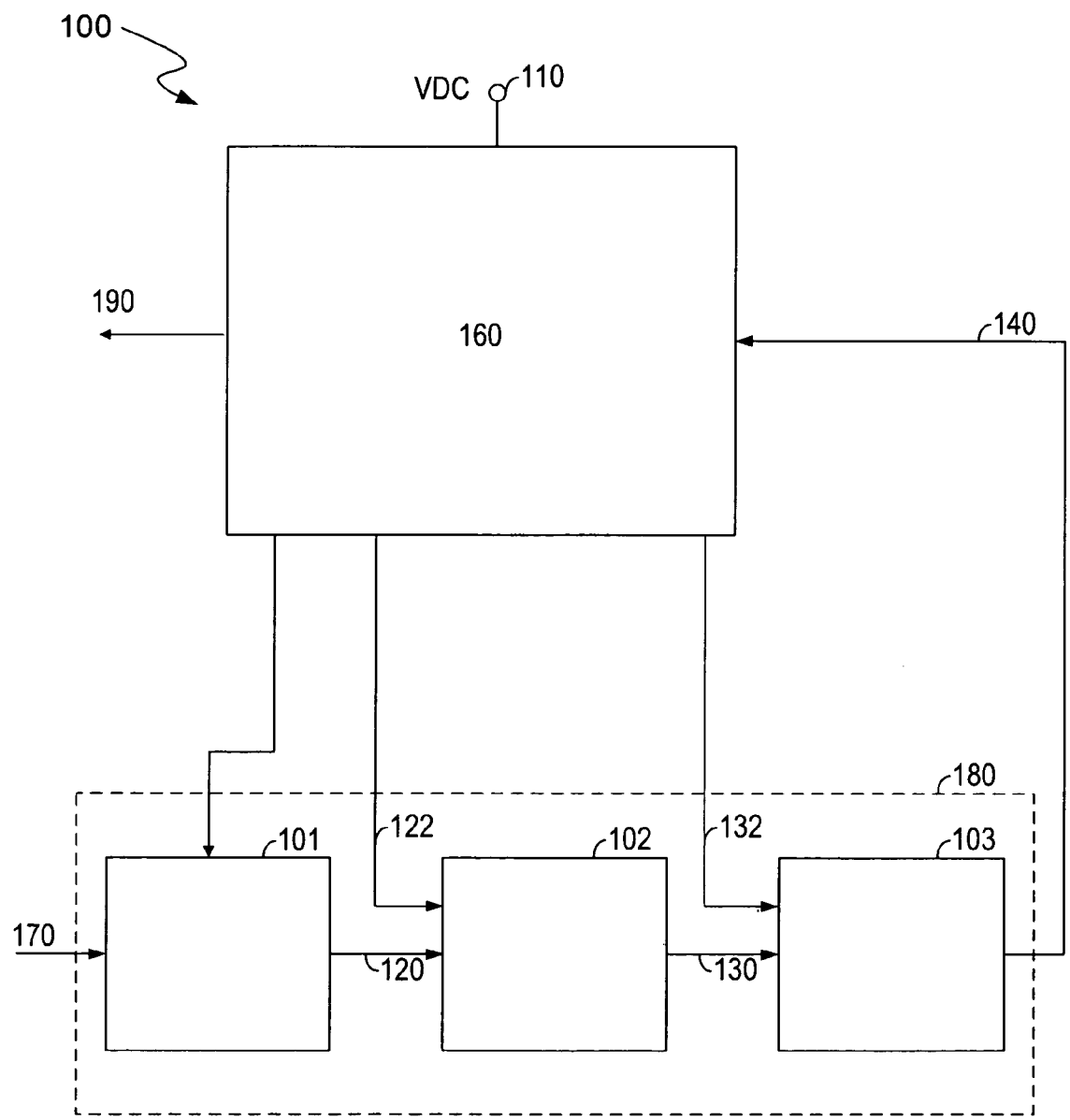
FIG. 1 shows a block diagram of a low distortion class-D amplifier, in accordance with one embodiment of the present invention.

FIG. 1 shows a block diagram of a low distortion class-D amplifier 100, in accordance with one embodiment of the present invention. The class-D amplifier 100 has a high power supply rejection ratio. As shown in FIG. 1, the class-D amplifier 100 comprises a power supply terminal 110 for receiving a power supply VDC, an amplification stage 180, and an output stage 160.

The amplification stage 180 receives an input signal 170 and generates a ramp signal 130. The amplification stage 180 generates a pulse width modulation signal 140 based on the ramp signal 130 and a hysteretic signal 132 that is used to drive the output stage 160. Advantageously, the ramp signal 130 and the hysteretic signal 132 are positioned at a voltage level that is half the voltage level of the power supply VDC and varies proportionally with the power supply VDC.

The output stage 160 coupled to the power supply terminal 110 receives the pulse width modulation signal 140 from the amplification stage 180 and generates an amplified output signal 190. In one embodiment, the output stage 160 comprises a full bridge circuit.

As shown in FIG. 1, the amplification stage 180 comprises a first circuit shown as the translation stage 101 coupled to the full bridge circuit 160 for receiving the input signal 170 and producing a translated signal 120 that is positioned at a voltage level that is half the voltage of the power supply.

The amplification stage 180 further comprises a second circuit shown as the integrating stage 102 that receives the translated signal 120 from the first circuit (translation stage) 101 and an integrating signal 122 from the full bridge circuit 160, and generates the ramp signal 130 therefrom. Therefore, an oscillator and a ramp generator are not needed in the present invention.

A comparison stage 103 receives the ramp signal 130 and the hysteretic signal 132, and generates the pulse width modulation signal 140 to drive the full bridge circuit 160.

To summarize, the amplifier 100 in FIG. 1 comprises a power supply terminal 110 for receiving power; a full bridge circuit 160 coupled to the power supply terminal 110 for providing an amplified output 190; a translation stage 101 coupled to the full bridge circuit 160 for receiving an input signal 170 and producing a translated signal 120 that is positioned at a voltage level that is half the voltage level of the power supply VDC; an integrating stage 102 that receives the translated signal 120 from the translation stage 101 and an integrating signal 122 from the full bridge circuit 160, and generates a ramp signal 130 therefrom; and a comparison stage 103 that receives the ramp signal 130 from the integrating stage 102 and a hysteretic signal 132 from the full bridge circuit 160, and generates a pulse width modulation signal 140 for driving the full bridge circuit 160.

Advantageously, the ramp signal 130 and the hysteretic signal 132 are positioned at a voltage level that is half the voltage level of the power supply and that varies proportionally with the power supply.

Figure 2:
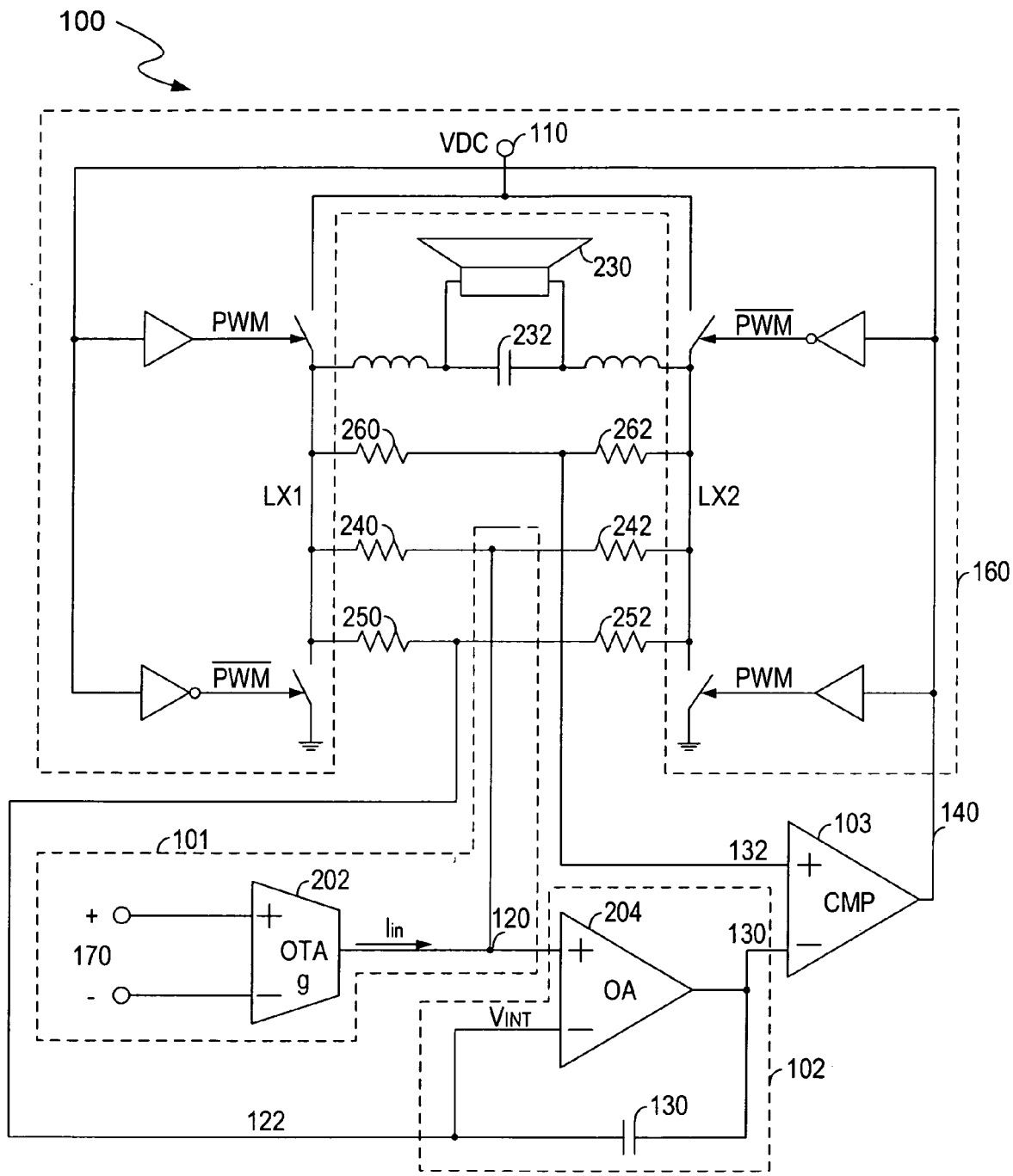
FIG. 2 shows a detailed circuit diagram of the low distortion amplifier in FIG. 1 coupled to a loud speaker, in accordance with one embodiment of the present invention.

FIG. 2 shows a detailed circuit diagram of the low distortion amplifier 100 in FIG. 1 coupled to a loud speaker, in accordance with one embodiment of the present invention. Elements labeled the same in FIG. 1 have similar functions and will not be repetitively described herein for purposes of brevity and clarity.

The amplifier 100 in FIG. 2 further comprises a first resistor divider coupled between the first switching node LX1 and the second switching node LX2 of the full bridge circuit 160 for providing the hysteretic signal 132 to the comparison circuit 103.

The first resistor divider comprises a first resistor 260 and a second resistor 262. In one embodiment, the first resistor 260 comprises a first resistance R1 less a second resistance $\Delta R1$. In one embodiment, the second resistor 262 comprises the first resistance R1 added to the second resistance $\Delta R1$. Therefore, $R_{260}=R1-\Delta R1$ and $R_{262}=R1+\Delta R1$.

The amplifier 100 further comprises a second resistor divider, shown as resistors 250 and 252, coupled between the first switching node LX1 and the second switching node LX2 of the full bridge circuit 160 for providing the integrating signal 122 to the second circuit (integrating stage) 102.

The second resistor divider comprises a first resistor 250 and a second resistor 252. In one embodiment, the first resistor 250 comprises a first resistance R2 added to a second resistance $\Delta R2$. In one embodiment, the second resistor 252 comprises the first resistance R2 subtracted from the second resistance $\Delta R2$. Therefore, $R_{250}=R2+\Delta R2$ and $R_{252}=R2-\Delta R2$.

The first circuit shown as the translation stage 101 comprises an operational transconductance amplifier 202 which is coupled to the second circuit (integrating stage) 102 for converting the input signal 170 to an input current $I_{in}$. The translation stage 101 further comprises a resistor divider, shown as resistors 240 and 242, coupled between LX1 and LX2 for receiving the input current $I_{in}$ and producing a translated signal 120 that is positioned at half of the voltage level of the power supply VDC. The resistor 240 and resistor 242 have the same resistance R.

The second circuit shown as the integrating stage 102 comprises an operational amplifier 204 and a capacitor 234. The integrating stage 102 receives the translated signal 120 and the integrating signal 122, and generates a ramp signal 130 to the comparison stage 103.

The comparison stage shown as the comparator 103 compares the hysteretic signal 132 with the ramp signal 130, and generates a pulse width modulation signal 140 to drive the full bridge circuit 160. The output capacitor 232 that is coupled between the first switching node LX1 and the second switching node LX2 provides the amplified output signal to the speaker 230. As such, the speaker 230 receives the amplified audio signal and generates audible sound therefrom.

In one embodiment, the input signal 170 comprises an input voltage $V_{in}$. In operation, the operational transconductance amplifier 202 converts the input voltage $V_{in}$ to an input current $I_{in}$ and uses the resistor divider (shown as resistor 240 and resistor 242) to create a translated signal 120 that is positioned at half of the voltage level of the supply voltage VDC from terminal 110. If we assume that the gain of the operational transconductance amplifier 202 is g, then the voltage of the translated signal 120 is given by:

$$V_{120}=g*(R/2)*V_{in}+VDC/2 \tag{1}$$

It should be noted that the first switching node LX1 and the second switching node LX2 of the full bridge circuit 160 are always out of phase. Therefore, the integrating current $I_{122}$ will have two different levels depending on the state of the switching nodes LX1 and LX2. In one embodiment, when the pulse width modulation signal 140 is high, the voltage at LX1 is VDC and voltage at LX2 is zero. In contrast, when the pulse width modulation signal 140 is low, the voltage at LX1 is zero and the voltage at LX2 is VDC.

Since the voltage $V_{int}$ at the inverting input of the operational amplifier 204 is equal to the voltage $V_{120}$ at the non-inverting input of the operational amplifier 204, the integrating current $I_{122}$ when the pulse width modulation signal 140 is high and the integrating current $I_{122}'$ when the pulse width modulation signal 140 is low can be calculated as:

$$I_{122}=(VCD-V_{120})/(R2+\Delta R2)-V_{120}/(R2-\Delta R2), \text{ when the pulse width modulation signal 140 is high;} \tag{2}$$

$$I_{122}'=(VCD-V_{120})/(R2-\Delta R2)-V_{120}/(R2+\Delta R2), \text{ when the pulse width modulation signal 140 is low.} \tag{3}$$

Based on equation (1), equations (2) and (3) can be rewritten as:

$$I_{122}=(-VCD*\Delta R2-g*R*V_{in}*R2)/(R2^2-\Delta R2^2), \text{ when the pulse width modulation signal 140 is high;} \tag{4}$$

$$I_{122}'=(VCD*\Delta R2-g*R*V_{in}*R2)/(R2^2-\Delta R2^2), \text{ when the pulse width modulation signal 140 is low.} \tag{5}$$

The voltage of the hysteretic signal 132 is $$V_{132}=VDC*(R1+\Delta R1)/2R1=VDC/2+VDC*\Delta R1/2R1, \text{ when the pulse width modulation signal 140 is high;} \tag{6}$$

$$V_{132}'=VDC*(R1-\Delta R1)/2R1=VDC/2-VDC*\Delta R1/2R1, \text{ when the pulse width modulation signal 140 is low.} \tag{7}$$

Therefore, the amplitude of the ramp signal 130 is the difference between $V_{132}$ and $V_{132}'$, that is:

$$A_{130}=VDC*\Delta R1/R1. \tag{8}$$

As such, a parameter limit of the ramp signal 130 is defined by the first resistance R1 and the second resistance $\Delta R1$ of the first resistor divider (shown as resistors 260 and 262). In one embodiment, the aforementioned parameter limit of the ramp signal 130 comprises the amplitude $A_{130}$ of the ramp signal 130.

Figure 3:
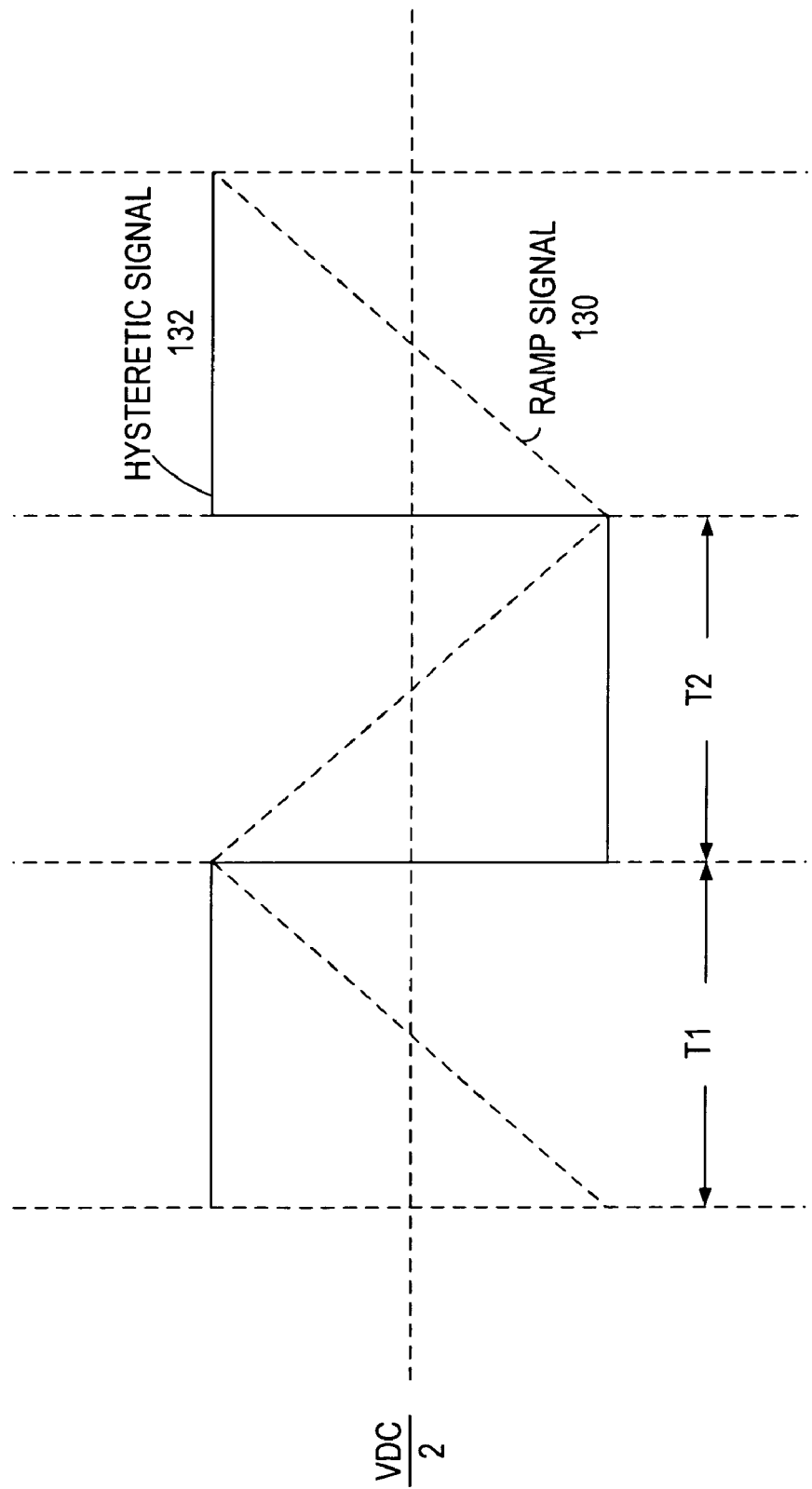
FIG. 3 shows the waveforms for the hysteretic signal and the ramp signal, in accordance with one embodiment of the present invention.

FIG. 3 shows the waveforms for the hysteretic signal 132 and the ramp signal 130, in accordance with one embodiment of the present invention. In FIG. 3, T1 is the period when the pulse width modulation signal 140 is high and T2 is the period when the pulse width modulation signal 140 is low.

As shown in FIG. 3, during period T1, the voltage level of the hysteretic signal 132 is above the VDC/2 level according to equation (6). When the hysteretic signal 132 is greater than the ramp signal 130, the comparator 103 maintains a high pulse width modulation signal. As the voltage of the ramp signal 130 increases towards the hysteretic signal 132, the ramp signal 130 reaches the same level of the hysteretic signal 132 at a certain point. Then the comparator 103 outputs a low signal. As a result, the hysteretic signal 132 drops below the VDC/2 level and the ramp signal 130 gradually decreases towards the hysteretic signal 132 as shown in period T2. The comparator 103 continues to output a low signal until the ramp signal 130 decreases to the same level of the hysteretic signal 132.

Advantageously, both hysteretic signal 132 and ramp signal 130 are positioned at a voltage level that is half of the power supply voltage VDC.

Turning back to FIG. 1, the charge change $\Delta Q$ of the capacitor 230 in the integrating stage 102 is $$\Delta Q=C_{230}*A_{130}=-I_{122}*T1=I_{122}'*T2. \tag{9}$$

Therefore, when equations (3) and (4) are substituted into equation (9), the following equation will be obtained:

$$VDC*(T2-T1)/(T2+T1) = g*R*R2/\Delta R2*V_{in}. \quad (10)$$

The equivalent theoretical output voltage 190 across the output capacitor 232 is equal to:

$$V_{190} = T1/(T1+T2)*VDC - T2/(T1+T2)*VDC \quad (11)$$
$$= (T1-T2)/(T1+T2)*VDC.$$

Therefore, the gain of the amplifier 100 is:

$$A = V_{190}/V_{in} = -g*R*R2/\Delta R2. \quad (12)$$

It will be appreciated that the gain A of the amplifier 100 remains constant when the input signal 170 varies. Therefore, the gain of the amplifier 100 does not depend on the input voltage Vin, which assures high power supply rejection ratio.

According to equation (9), the switching frequency of the full bridge circuit 160 is:

$$f_{sw} = 1/(T1+T2) = 1/((-C_{230}*A_{130}/I_{122}) + (C_{230}*A_{130}/I_{122}')) \quad (13)$$

When equation (2) and (3) are substituted into equation (13), the switching frequency becomes:

$$f_{sw} = (VDC^2*\Delta R2^2 - g^2*R^2*V_{in}^2*R2^2)/(C_{230}*A_{130}(R2^2-\Delta R2^2)*2*VDC*\Delta R2) \quad (14)$$

When equation (8) is substituted into equation (14), the switching frequency becomes:

$$f_{sw} = R1*\Delta R2/(2*C_{230}*\Delta R1*(R2^2-\Delta R2^2)) - g^2*R^2*V_{in}^2*R2^2*R1/(2*C_{230}*\Delta R1*VDC^2*\Delta R2^2*(R2^2-\Delta R2^2)) \quad (15)$$

If we assume $K_1 = R1*\Delta R2/(2*C_{230}*\Delta R1*(R2^2-\Delta R2^2))$ and $K_2 = g^2*R^2*R2^2*R1/(2*C_{230}*\Delta R1*\Delta R2^2*(R2^2-\Delta R2^2))$ then equation (15) becomes:

$$f_{sw} = K_1 - K_2*(V_{in}/VDC)^2 \quad (16)$$

It should be appreciated that $K_1$ and $K_2$ are constant. The switching frequency $f_{sw}$ only relates to the input voltage $V_{in}$ and the supply voltage VDC. As such, the switching frequency $f_{sw}$ remains constant when the input signal is zero.

Accordingly, the present invention provides a low distortion class-D amplifier with high power supply rejection ratio. The gain of the class-D amplifier does not depend on the input signal. In addition, no oscillator and ramp generator is required in the present invention. In addition, the present invention also provides an audio system comprising a low distortion class-D amplifier for receiving an audio signal, and a speaker coupled to the low distortion class-D amplifier for converting the audio signal to audible sound.

While the foregoing description and drawings represent the preferred embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. An amplifier comprising:
    a power supply terminal for receiving power;
    an amplification stage that receives an input signal and generates a ramp signal, wherein said amplification stage generates a pulse width modulation signal based on said ramp signal and a hysteretic signal; and
    an output stage coupled to said power supply terminal for receiving said pulse width modulation signal and generating an output;
    wherein said ramp signal and said hysteretic signal are positioned about a voltage level that is half the voltage level of said power supply.

2. The amplifier as claimed in claim 1, wherein said output stage comprises a full bridge circuit.

3. The amplifier as claimed in claim 2, wherein said amplification stage comprises a first circuit coupled to said full bridge circuit for receiving said input signal and producing a translated signal that is positioned at a voltage level that is half the voltage level of said power supply.

4. The amplifier as claimed in claim 3, wherein said amplification stage further comprises a second circuit that receives said translated signal from said first circuit and an integrating signal from said full bridge circuit, and generates said ramp signal therefrom.

5. The amplifier as claimed in claim 2, further comprising:
    a resistor divider coupled between a first switching node and a second switching node of said full bridge circuit for providing said hysteretic signal.

6. The amplifier as claimed in claim 2, further comprising:
    a resistor divider coupled between a first switching node and a second switching node of said full bridge circuit for providing said integrating signal.

7. The amplifier as claimed in claim 4, wherein said first circuit comprises an operational amplifier coupled to said second circuit for converting said input signal to an input current.

8. The amplifier as claimed in claim 7, wherein said first circuit comprises a resistor divider coupled between a first switching node and a second switching node of said full bridge circuit for receiving said input current from said operational amplifier and producing said translated signal that is positioned at half the voltage level of said power supply.

9. The amplifier as claimed in claim 5, wherein said resistor divider comprises:
    a first resistor comprising a first resistance less a second resistance; and
    a second resistor comprising said first resistance added to said second resistance.

10. The amplifier as claimed in claim 6, wherein said resistor divider comprises:
    a first resistor comprising a first resistance added to a second resistance; and
    a second resistor comprising said first resistance less said second resistance.

11. The amplifier as claimed in claim 9, wherein a parameter limit of said ramp signal is defined by said first resistance and said second resistance of said resistor divider.

12. The amplifier as claimed in claim 11, wherein said parameter limit comprises an amplitude.

13. The amplifier as claimed in claim 1, wherein a gain of said amplifier remains constant when said input signal varies.

14. The amplifier as claimed in claim 2, wherein a switching frequency of said full bridge circuit remains constant when said input signal is zero.

15. An amplifier comprising:
a power supply terminal for receiving power;
a full bridge circuit coupled to said power supply terminal for providing an amplified output;
an translation stage coupled to said full bridge circuit for receiving an input signal and producing a translated signal that is positioned at a voltage level that is half the voltage level of said power supply;
an integrating stage that receives said translated signal from said translation stage and an integrating signal from said full bridge circuit, and generates a ramp signal therefrom; and
a comparison stage that receives said ramp signal from said integrating stage and a hysteretic signal from said full bridge circuit, and generates a pulse width modulation signal for driving said full bridge circuit,
wherein said ramp signal and said hysteretic signal are positioned around a voltage level that is half the voltage level of said power supply.

16. The amplifier as claimed in claim 15, further comprising:
a resistor divider coupled between a first switching node and a second switching node of said full bridge circuit for providing said hysteretic signal.

17. The amplifier as claimed in claim 15, further comprising:
a resistor divider coupled between a first switching node and a second switching node of said full bridge circuit for providing said integrating signal.

18. The amplifier as claimed in claim 15, wherein said translation stage comprises an operational amplifier coupled to said integrating stage for converting said input signal to an input current.

19. The amplifier as claimed in claim 18, wherein said translation stage comprises a resistor divider coupled between a first switching node and a second switching node of said full bridge circuit for receiving said input current from said operational amplifier and producing said translated signal that is positioned at half the voltage level of said power supply.

20. An audio system comprising:
an amplifier for receiving an audio signal, said amplifier comprising:
a power supply terminal for receiving power;
an amplification stage that receives an input signal and generates a ramp signal, wherein said amplification stage generates a pulse width modulation signal based on said ramp signal and a hysteretic signal; and
an output stage for receiving said pulse width modulation signal and generating an output;
wherein said ramp signal and said hysteretic signal are positioned about a voltage level that is half the voltage level of said power supply; and
a speaker coupled to said amplifier for converting said audio signal to audible sound.

21. The audio system as claimed in claim 20, wherein said output stage comprises a full bridge circuit.

22. The audio system as claimed in claim 21, wherein said amplification stage comprises a first circuit coupled to said full bridge circuit for receiving said input signal and producing a translated signal that is positioned at a voltage level that is half the voltage level of said power supply.

23. The audio system as claimed in claim 22, said amplification stage further comprises a second circuit that receives said translated signal from said first circuit and an integrating signal from said full bridge circuit, and generates said ramp signal therefrom.

24. The amplifier as claimed in claim 1 wherein said hysteretic signal comprises a step-wise signal that fluctuates between a first voltage that is above said voltage level and a second voltage that is below said voltage level, wherein said hysteretic signal transitions from said first voltage to said second voltage when a voltage of said ramp signal increases to said first voltage, and wherein said hysteretic signal transitions from said second voltage to said first voltage when voltage of said ramp signal decreases to said second voltage.

25. The amplifier as claimed in claim 15 wherein said ramp signal increases in voltage until said ramp signal and said hysteretic signal are equal in voltage, at which point said hysteretic signal decreases in voltage to less than said voltage level, wherein said ramp signal then decreases in voltage until said ramp signal and said hysteretic signal are again equal in voltage, at which point said hysteretic signal increases in voltage to greater than said voltage level.

26. The audio system as claimed in claim 20 wherein said hysteretic signal comprises a step-wise signal that fluctuates between a first voltage that is above said voltage level and a second voltage that is below said voltage level, wherein said hysteretic signal transitions from said first voltage to said second voltage when a voltage of said ramp signal increases to said first voltage, and wherein said hysteretic signal transitions from said second voltage to said first voltage when voltage of said ramp signal decreases to said second voltage.

\* \* \* \* \*